(12) United States Patent
Aoki

(10) Patent No.: US 10,304,892 B2
(45) Date of Patent: May 28, 2019

(54) SOLID-STATE IMAGING DEVICE AND IMAGING APPARATUS

(71) Applicant: OLYMPUS CORPORATION, Hachioji-shi, Tokyo (JP)

(72) Inventor: Jun Aoki, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 0 days.

(21) Appl. No.: 15/889,509

(22) Filed: Feb. 6, 2018

(65) Prior Publication Data

US 2018/0166492 A1    Jun. 14, 2018

Related U.S. Application Data

(63) Continuation of application No. PCT/JP2015/078166, filed on Oct. 5, 2015.

(51) Int. Cl.
 *H01L 27/146* (2006.01)
 *H04N 5/369* (2011.01)
 *H04N 5/225* (2006.01)
 *H04N 5/374* (2011.01)

(52) U.S. Cl.
 CPC .. *H01L 27/14636* (2013.01); *H01L 27/14634* (2013.01); *H04N 5/225* (2013.01); *H04N 5/369* (2013.01); *H04N 5/3741* (2013.01)

(58) Field of Classification Search
 CPC ................................................. H01L 27/14636
 See application file for complete search history.

(56) References Cited

U.S. PATENT DOCUMENTS

| 8,773,562 B1* | 7/2014 | Fan | H01L 27/14643 |
| | | | 348/308 |
| 2010/0084755 A1* | 4/2010 | Gerber | B23K 1/0016 |
| | | | 257/690 |
| 2011/0157445 A1 | 6/2011 | Itonaga et al. | |

(Continued)

FOREIGN PATENT DOCUMENTS

| JP | 2011-151375 A | 8/2011 |
| JP | 2012-248953 A | 12/2012 |

(Continued)

OTHER PUBLICATIONS

International Search Report dated Nov. 17, 2015, issued in Counterpart of International Application No. PCT/JP2015/078166. w/English Translation (4 pages).

*Primary Examiner* — Raj R Gupta
(74) *Attorney, Agent, or Firm* — Westerman, Hattori, Daniels & Adrian, LLP

(57) ABSTRACT

A solid-state imaging device includes a first substrate, a second substrate, a plurality of first connectors, and a plurality of second connectors. The plurality of first connectors are configured to transmit a first signal. The plurality of second connectors are configured to transmit a second signal. The first signal has at least two levels, and the levels of the first signal discretely vary between the at least two levels. The second signal is a continuous time signal. A first area of a first region is smaller than a second area of a second region. The first region is a projection region of each of the plurality of first connectors in a principal surface of the first substrate. The second region is a projection region of each of the plurality of second connectors in the principal surface.

9 Claims, 8 Drawing Sheets

(56) References Cited

U.S. PATENT DOCUMENTS

| | | | |
|---|---|---|---|
| 2012/0217374 A1* | 8/2012 | Nishizawa | H01L 27/14618 250/208.1 |
| 2013/0070133 A1 | 3/2013 | Takazawa | |
| 2014/0145338 A1 | 5/2014 | Fujii et al. | |
| 2014/0327101 A1 | 11/2014 | Mori et al. | |

FOREIGN PATENT DOCUMENTS

| | | |
|---|---|---|
| JP | 2013-168720 A | 8/2013 |
| JP | 2014-165396 A | 9/2014 |
| JP | 2015-32663 A | 2/2015 |
| WO | 2012/161044 A1 | 11/2012 |
| WO | 2013/084529 A1 | 6/2013 |

* cited by examiner

SOLID-STATE IMAGING DEVICE AND IMAGING APPARATUS

The present application is a continuation application based on international patent application PCT/JP 2015/078166, filed Oct. 5, 2015, the content of which is incorporated herein by reference.

BACKGROUND OF THE INVENTION

Field of the Invention

The present invention relates to a solid-state imaging device and an imaging apparatus.

Description of Related Art

A solid-state imaging device having a plurality of substrates is disclosed. For example, a solid-state imaging device in which a first substrate and a second substrate are laminated is disclosed in Japanese Unexamined Patent Application, First Publication No. 2015-032663 and Japanese Unexamined Patent Application, First Publication No. 2014-165396. In the solid-state imaging device disclosed in Japanese Unexamined Patent Application, First Publication No. 2015-032663 and Japanese Unexamined Patent Application, First Publication No. 2014-165396, a plurality of pixels are arranged on the first substrate and a part of a circuit other than the pixels is arranged on the second substrate. Accordingly, the occupancy of pixels to the footprint of a chip is improved.

SUMMARY OF THE INVENTION

According to a first aspect of the present invention, a solid-state imaging device includes a first substrate, a second substrate, a plurality of first connectors, and a plurality of second connectors. The first substrate has a principal surface and a plurality of pixels arranged in a matrix. The second substrate is laminated on the first substrate. The plurality of first connectors are configured to electrically connect the first substrate and the second substrate and transmit a first signal. The plurality of second connectors are configured to electrically connect the first substrate and the second substrate and transmit a second signal. The level of the first signal discretely varies between at least two levels. The second signal is a continuous time signal. A first area of a first region is smaller than a second area of a second region. The first region is a projection region of each of the plurality of first connectors in the principal surface. The second region is a projection region of each of the plurality of second connectors in the principal surface.

According to a second aspect of the present invention, in the first aspect, a first dimension of the first region may be less than a second dimension of the second region. The first dimension and the second dimension may be dimensions in a direction of rows or columns in arrangement of the plurality of pixels.

According to a third aspect of the present invention, in the first aspect, the first signal may include a transfer control signal, a reset control signal and a select control signal, each of which is for controlling the plurality of pixels. The first area corresponding to the first connector for transmitting the select control signal may be smaller than the first area corresponding to the first connector for transmitting the transfer control signal. The first area corresponding to the first connector for transmitting the select control signal may be smaller than the first area corresponding to the first connector for transmitting the reset control signal.

According to a fourth aspect of the present invention, in the third aspect, the first area corresponding to the first connector for transmitting the reset control signal may be smaller than the first area corresponding to the first connector for transmitting the transfer control signal.

According to a fifth aspect of the present invention, in any one of the first to fourth aspects, each of the plurality of first connectors and the plurality of second connectors may include a first electrode and a second electrode that are in contact with each other. The first electrode may be in contact with the first substrate and the second electrode may be in contact with the second substrate.

According to a sixth aspect of the present invention, in any one of the first to fourth aspects, each of the plurality of first connectors and the plurality of second connectors may include a bump arranged between the first substrate and the second substrate.

According to a seventh aspect of the present invention, in any one of the first to fourth aspects, each of the plurality of first connectors and the plurality of second connectors may include a penetration electrode penetrating at least one of the first substrate and the second substrate arranged across the first substrate and the second substrate.

According to an eighth aspect of the present invention, in any one of the first to fourth aspects, each of the plurality of first connectors may include a first electrode and a second electrode that are in contact with each other. The first electrode may be in contact with the first substrate and the second electrode may be in contact with the second substrate. Each of the plurality of second connectors may include a penetration electrode penetrating at least one of the first substrate and the second substrate arranged across the first substrate and the second substrate.

According to a ninth aspect of the present invention, an imaging apparatus includes the solid-state imaging device.

DETAILED DESCRIPTION OF THE INVENTION

Embodiments of the present invention will be described with reference to the drawings.

First Embodiment

Figure 1:
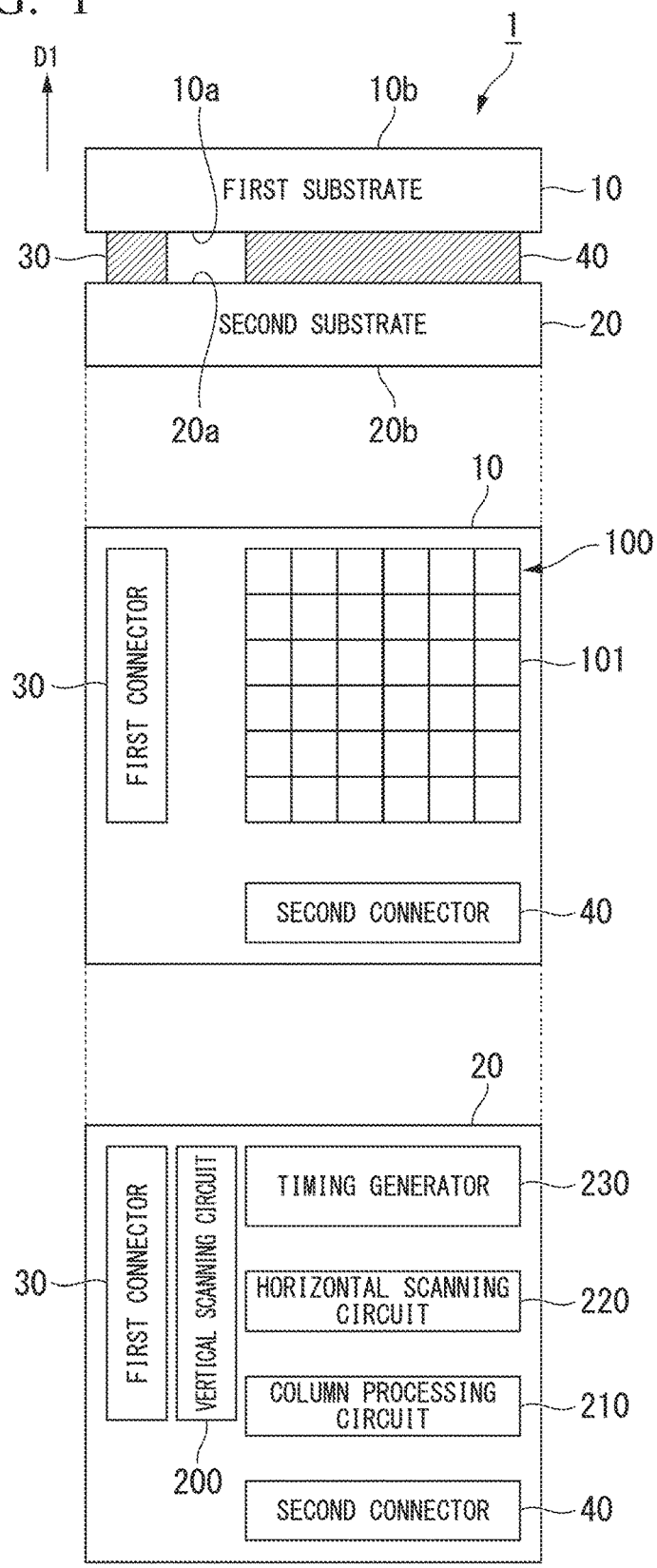
FIG. 1 is a cross-sectional view and a plan view of a solid-state imaging device according to a first embodiment of the present invention.

FIG. 1 shows the configuration of a solid-state imaging device 1 according to a first embodiment of the present invention. FIG. 1 includes a cross-sectional view of the solid-state imaging device 1 and plan views of a first substrate 10 and a second substrate 20 included in the solid-state imaging device 1.

As shown in FIG. 1, the solid-state imaging device 1 includes the first substrate 10, the second substrate 20, a plurality of first connectors 30 and a plurality of second connectors 40. In FIG. 1, the plurality of first connectors 30 and the plurality of second connectors 40 are shown as an aggregate of a plurality of connectors.

The first substrate 10 and the second substrate 20 are laminated in the thickness direction D1 of the first substrate 10. The first substrate 10 has a first principal surface 10a and a second principal surface 10b. The second substrate 20 has a first principal surface 20a and a second principal surface 20b. The first principal surface 10a and the second principal surface 10b are relatively wide surfaces among a plurality of surfaces forming the surface of the first substrate 10. The first principal surface 20a and the second principal surface 20b are relatively wide surfaces among a plurality of surfaces of the second substrate 20. The first principal surface 10a and the second principal surface 20a face each other.

The plurality of first connectors 30 and the plurality of second connectors 40 are arranged between the first substrate 10 and the second substrate 20. The plurality of first connectors 30 and the plurality of second connectors 40 are in contact with the first substrate 10 and the second substrate 20. The plurality of first connectors 30 and the plurality of second connectors 40 electrically connect the first substrate 10 and the second substrate 20.

The plan view of the first substrate 10 schematically shows arrangement of each component of the first substrate 10. The plan view of the first substrate 10 is shown as a transparent diagram. Each component in the first substrate 10 is not necessarily arranged on the first principal surface 10a. At least some components in the first substrate 10 may be arranged inside of the first substrate 10. Wirings for transmitting signals in the first substrate 10 are omitted.

The first substrate 10 has a pixel unit 100. The pixel unit 100 includes a plurality of pixels 101. The plurality of pixels 101 are arranged in a matrix. The number of rows and the number of columns in the arrangement of the plurality of pixels 101 are greater than or equal to 2. FIG. 1 shows an example in which the number of rows and the number of columns are 6. The number of rows need not be the same as the number of columns. The plurality of pixels 101 output a pixel signal corresponding to the quantity of light incident on the solid-state imaging device 1. The pixel signal is a continuous time signal.

The plurality of first connectors 30 and the plurality of second connectors 40 are arranged around the pixel unit 100. The plurality of first connectors 30 and the plurality of second connectors 40 are electrically connected to the pixel unit 100. The plurality of first connectors 30 transmit a control signal for controlling the plurality of pixels 101 from the second substrate 20 to the first substrate 10. The control signal is a signal whose level discretely changes. The plurality of first connectors 30 output the control signal to the plurality of pixels 101. The plurality of pixels 101 output a pixel signal to the plurality of second connectors 40. The plurality of second connectors 40 transmit the pixel signal output from the plurality of pixels 101 from the first substrate 10 to the second substrate 20.

The plan view of the second substrate 20 schematically shows arrangement of each component of the second substrate 20. The plan view of the second substrate 20 is shown as a transparent diagram. Each component in the second substrate 20 is not necessarily arranged on the first principal surface 20a. At least some components in the second substrate 20 may be arranged inside of the second substrate 20. Wirings for transmitting signals in the second substrate 20 are omitted.

The second substrate 20 includes a vertical scanning circuit 200, a column processing circuit 210, a horizontal scanning circuit 220, and a timing generator 230. The vertical scanning circuit 200 generates a control signal for controlling operations of the plurality of pixels 101. The vertical scanning circuit 200 generates a control signal corresponding to each of a plurality of rows in the arrangement of the plurality of pixels 101. The column processing circuit 210 performs signal processing on a pixel signal. For example, signal processing performed by the column processing circuit 210 includes noise reduction. The horizontal scanning circuit 220 sequentially selects columns in the arrangement of the plurality of pixels 101. Pixel signals corresponding to columns selected by the horizontal scanning circuit 220 are sequentially output to the outside of the solid-state imaging device 1. The timing generator 230 generates a driving clock signal. The driving clock signal generated by the timing generator 230 is supplied to the vertical scanning circuit 200, the column processing circuit 210 and the horizontal scanning circuit 220.

The plurality of first connectors 30 are electrically connected to the vertical scanning circuit 200. The vertical scanning circuit 200 outputs a control signal to the plurality of first connectors 30. The plurality of second connectors 40 are electrically connected to the column processing circuit 210. The plurality of second connectors 40 output a pixel signal to the column processing circuit 210.

Figure 2:
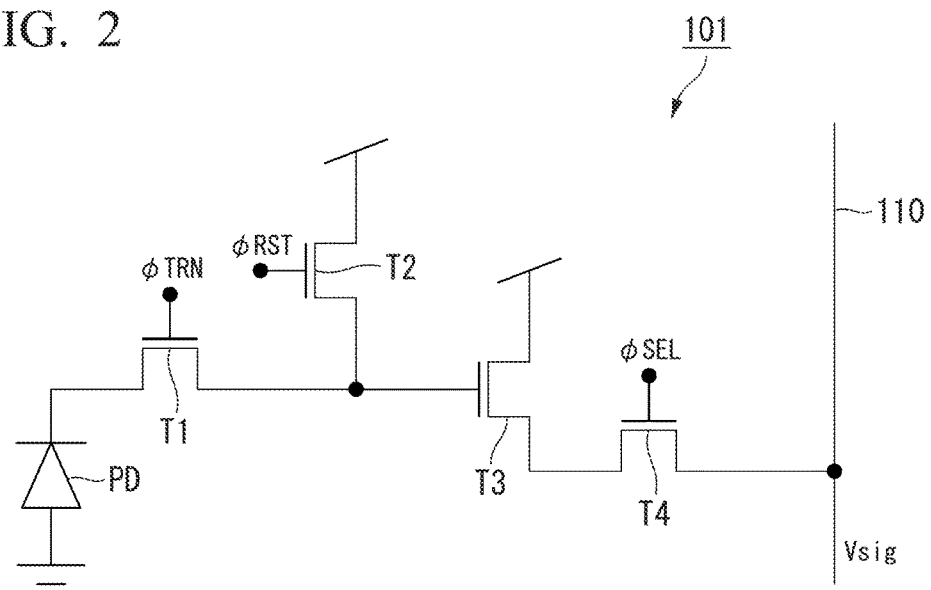
FIG. 2 is a circuit diagram showing the configuration of a pixel in the solid-state imaging device according to the first embodiment of the present invention.

FIG. 2 shows the configuration of the pixel 101. As shown in FIG. 2, the pixel 101 includes a photoelectric conversion element PD, a transfer transistor T1, a reset transistor T2, an amplification transistor T3, and a select transistor T4.

The photoelectric conversion element PD has a first terminal and a second terminal. The first terminal of the photoelectric conversion element PD is connected to the ground. The transfer transistor T1 has a first terminal, a second terminal, and a gate. The first terminal of the transfer transistor T1 is one of a source and a drain. The second terminal of the transfer transistor T1 is the other of the source and the drain. The first terminal of the transfer transistor T1 is connected to the second terminal of the photoelectric conversion element PD. A transfer control signal φTRN is supplied to the gate of the transfer transistor T1.

The reset transistor T2 has a first terminal, a second terminal and a gate. The first terminal of the reset transistor T2 is one of a source and a drain. The second terminal of the reset transistor T2 is the other of the source and the drain. A power supply voltage is supplied to the first terminal of the reset transistor T2. The second terminal of the reset transistor T2 is connected to the second terminal of the transfer transistor T1. A reset control signal φRST is supplied to the gate of the reset transistor T2.

The amplification transistor T3 has a first terminal, a second terminal and a gate. The first terminal of the amplification transistor T3 is one of a source and a drain. The second terminal of the amplification transistor T3 is the other of the source and the drain. The power supply voltage is supplied to the first terminal of the amplification transistor T3. The gate of the amplification transistor T3 is connected to the second terminal of the transfer transistor T1. The gate of the amplification transistor T3 forms a floating diffusion for accumulating charges.

The select transistor T4 has a first terminal, a second terminal and a gate. The first terminal of the select transistor T4 is one of a source and a drain. The second terminal of the select transistor T4 is the other of the source and the drain. The first terminal of the select transistor T4 is connected to the second terminal of the amplification transistor T3. The second terminal of the select transistor T4 is connected to a vertical signal line 110. The vertical signal line 110 is electrically connected to the second connector 40. A select control signal φSEL is provided to the gate of the select transistor T4.

For example, the photoelectric conversion element PD is a photodiode. The photoelectric conversion element PD generates charges based on light input to the pixel 101 and accumulates the generated charges. The transfer transistor T1 transfers the charges accumulated in the photoelectric conversion element PD to the gate of the amplification transistor T3. ON/OFF of the transfer transistor T1 is controlled by the transfer control signal φTRN.

The reset transistor T2 resets the gate of the amplification transistor T3. ON/OFF of the reset transistor T2 is controlled by the reset control signal φRST. The photoelectric conversion element PD may be reset by simultaneously turning on the reset transistor T2 and the transfer transistor T1. The gate of the amplification transistor T3 and the photoelectric conversion element PD are reset, and thus the quantity of charges accumulated in the gate of the amplification transistor T3 and the photoelectric conversion element PD is controlled. Consequently, states (potentials) of the gate of the amplification transistor T3 and the photoelectric conversion element PD are set to a reference state (reference potential, reset level). The amplification transistor T3 outputs a pixel signal Vsig obtained by amplifying a signal based on charges accumulated in the gate through the second terminal. The select transistor T4 outputs the pixel signal Vsig to the vertical signal line 110. ON/OFF of the select transistor T4 is controlled by the select control signal φSEL.

Control signals transmitted by the plurality of first connectors 30 include the transfer control signal φTRN, the reset control signal φRST, and the select control signal φSEL. The control signals have at least two levels and levels of the control signals discretely vary between the at least two levels. For example, the control signals have a high level and a low level. For example, in case of an N-type transistor, the transistor is turned on when the control signals have a high level and turned off when the control signals have a low level.

The control signals may have three values. For example, the solid-state imaging device 1 can operate at a plurality of frame rates. When the solid-state imaging device 1 operates at a first frame rate, the level of the transfer control signal φTRN is at a first high level (3.3 V) or a low level (0 V). When the solid-state imaging device 1 operates at a second frame rate, the level of the transfer control signal φTRN is at a second high level (4.0 V) or the low level (0 V). The second frame rate is higher than the first frame rate. When the level of the transfer control signal φTRN further increases, charge transfer by the transfer transistor T1 becomes faster.

Figure 3:
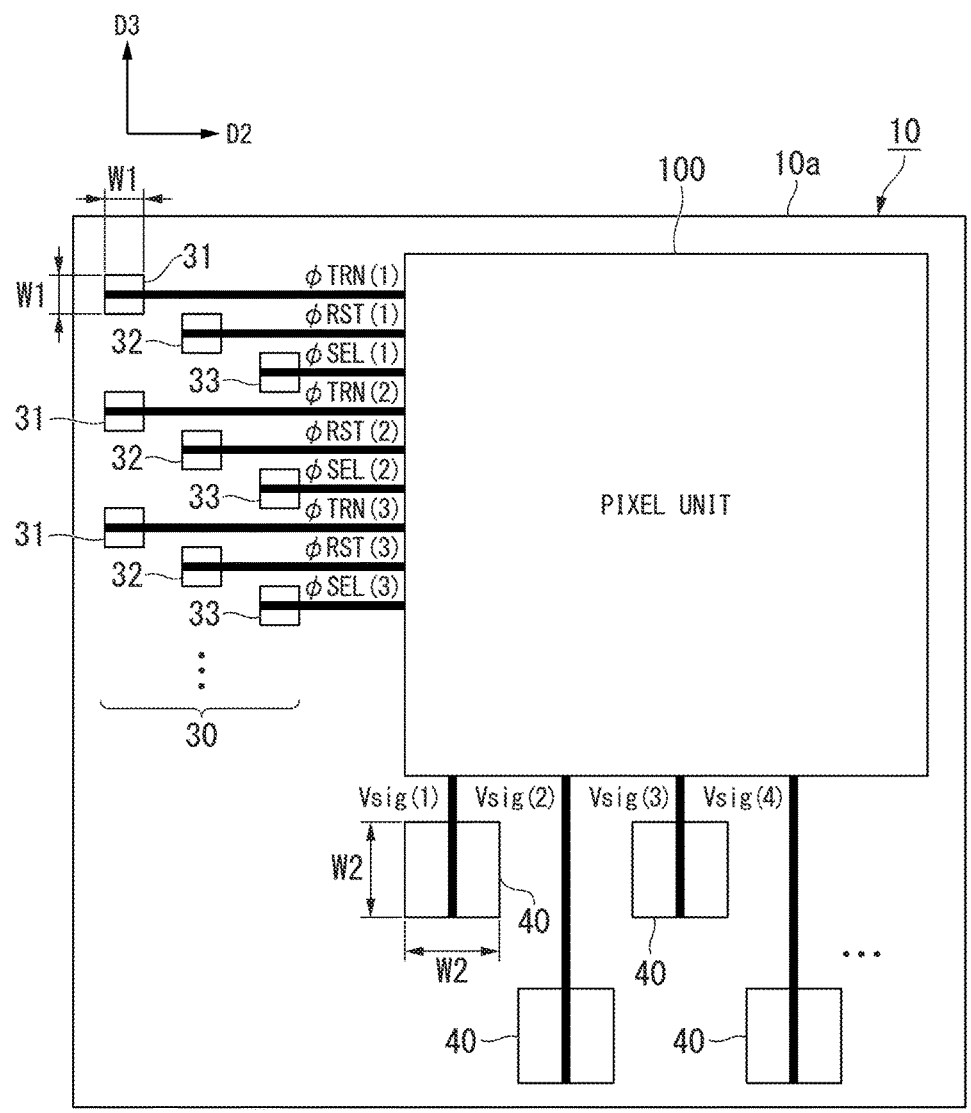
FIG. 3 is a plan view of a first substrate in the solid-state imaging device according to the first embodiment of the present invention.

FIG. 3 schematically shows arrangement of each component in the first substrate 10. FIG. 3 is shown as a transparent diagram of the first substrate 10. FIG. 3 shows a state of the first substrate 10 when viewed in a direction perpendicular to the first principal surface 10a.

Each of the plurality of first connectors 30 is arranged at a position corresponding to one of a plurality of rows in the arrangement of the plurality of pixels 101. The plurality of first connectors 30 include a plurality of first connectors 31, a plurality of first connectors 32 and a plurality of first connectors 33. The plurality of first connectors 31 transmit a transfer control signal φTRN(m). The plurality of first connectors 32 transmit a reset control signal φRST(m). The plurality of first connectors 33 transmit a select control signal φSEL(m). m is the number of a row in which the pixel 101 to which each control signal is supplied is arranged. In FIG. 3, some of the plurality of first connectors 30 are shown and the remaining first connectors are omitted.

Each of the plurality of second connectors 40 is arranged at a position corresponding to one of a plurality of columns in the arrangement of the plurality of pixels 101. The plurality of second connectors 40 transmit a pixel signal Vsig(n). n is the number of a column in which the pixel 101 which outputs each pixel signal is arranged. In FIG. 3, some of the plurality of second connectors 40 are shown and the remaining second connectors are omitted.

In FIG. 3, the plurality of first connectors 30 and the plurality of second connectors 40 have rectangular shapes. For example, the plurality of first connectors 30 and the plurality of second connectors 40 have square shapes. The shapes of the plurality of first connectors 30 and the plurality of second connectors 40 are not limited to rectangular shapes. For example, the plurality of first connectors 30 and the plurality of second connectors 40 may have circular shapes or polygonal shapes with five or more sides.

Each of the plurality of first connectors 30 overlaps a first region in the first principal surface 10a. The first region is a projection region of each of the plurality of first connectors 30 on the first principal surface 10a. That is, the first region is a region occupied by a projected image of each of the plurality of first connectors 30 when each of the plurality of first connectors 30 is virtually projected onto the first principal surface 10a. The contour of each of the plurality of first connectors 30 overlaps the contour of the first region when the first substrate 10 is viewed in a direction perpendicular to the first principal surface 10a. When the plurality of first connectors 30 are in contact with the first principal surface 10a, the first region is a region in which each of the plurality of first connectors 30 is in contact with the first principal surface 10a. The respective first connectors 30 correspond to the first regions arranged at different positions. The number of first connectors 30 is the same as the number of first regions. The first region may be a projection region of each of the plurality of first connectors 30 on the second principal surface 10b. The area of the first region corresponding to the first connector 31 is the same as the area of the first region corresponding to the first connector 32 and the area of the first region corresponding to the first connector 33.

Each of the plurality of second connectors 40 overlaps a second region in the first principal surface 10a. The second region is a projection region of each of the plurality of second connectors 40 on the first principal surface 10a. That is, the second region is a region occupied by a projected image of each of the plurality of second connectors 40 when each of the plurality of second connectors 40 is virtually projected onto the first principal surface 10*a*. The contour of each of the plurality of second connectors 40 overlaps the contour of the second region when the first substrate 10 is viewed in a direction perpendicular to the first principal surface 10*a*. When the plurality of second connectors 40 are in contact with the first principal surface 10*a*, the second region is a region in which each of the plurality of second connectors 40 is in contact with the first principal surface 10*a*. The respective second connectors 40 correspond to the second regions arranged at different positions. The number of second connectors 40 is the same as the number of second regions. The second region may be a projection region of each of the plurality of second connectors 40 on the second principal surface 10*b*.

The area of the first region is smaller than the area of the second region. The width of the first region in a row direction D2 is less than the width of the second region in the row direction D2. The width of the first region in a column direction D3 is less than the width of the second region in the column direction D3. For example, when the plurality of first connectors 30 and the plurality of second connectors 40 are square shaped, the width of the first connector 30 in the row direction D2 and the width in the column direction D3 are W1 and the width of the second connector 40 in the row direction D2 and the width in the column direction D3 are W2. That is, the width of the first region in the row direction D2 and the width in the column direction D3 are W1 and the width of the second region in the row direction D2 and the width in the column direction D3 are W2. W1 is less than W2. Accordingly, the area of the first region (W1×W1) is smaller than the area of the second region (W2×W2).

As described above, the solid-state imaging device 1 includes the first substrate 10, the second substrate 20, the plurality of first connectors 30 and the plurality of second connectors 40. The first substrate 10 has the principal surfaces (the first principal surface 10*a* and the second principal surface 10*b*) and the plurality of pixels 101 arranged in a matrix. The second substrate 20 is laminated on the first substrate 10. The plurality of first connectors 30 electrically connect the first substrate 10 and the second substrate 20 and transmit a control signal (first signal). The plurality of second connectors 40 electrically connect the first substrate 10 and the second substrate 20 and transmit a pixel signal (second signal). The control signal has at least two levels and levels of the control signal discretely vary between the at least two levels. The pixel signal is a continuous time signal. A first area of the first region is smaller than a second area of the second region. The first region is a projection region of each of the plurality of first connectors 30 on the principal surface. The second region is a projection region of each of the plurality of second connectors 40 on the principal surface.

A first dimension (first width) of the first region is less than a second dimension (second width) of the second region. The first dimension and the second dimension are dimensions in the direction of a row or a column (row direction D2 or column direction D3) in the arrangement of the plurality of pixels 101.

The first dimension and the second dimension may be dimensions in any direction parallel with the first principal surface 10*a*.

The first connector 30 has contact resistance with the first substrate 10 and the second substrate 20. The contact resistance has a variation corresponding to a variation in the area of the first connector 30. When the first connector 30 is composed of two electrodes, there is also contact resistance between the two electrodes. This contact resistance has a variation corresponding to an area variation caused by positional displacement between the two electrodes.

Similarly, the second connector 40 has contact resistance with the first substrate 10 and the second substrate 20. The contact resistance has a variation corresponding to a variation in the area of the second connector 40. When the second connector 40 is composed of two electrodes, there is also contact resistance between the two electrodes. This contact resistance has a variation corresponding to an area variation caused by a positional displacement between the two electrodes.

ON/OFF of transistors of the pixel 101 is controlled by a control signal. The influence of a minute voltage fluctuation of the control signal due to a contact resistance variation of the first connector 30 on the operations of the transistors is relatively insignificant. On the other hand, a minute voltage fluctuation of a pixel signal due to a contact resistance variation of the second connector 40 directly appears in an output value of the pixel signal. That is, the influence of the contact resistance variation of the first connector 30 on the control signal is smaller than the influence of the contact resistance variation of the second connector 40 on the pixel signal.

Accordingly, the area of the first connector 30 can be reduced to be smaller than the area of the second connector 40, and thus an arrangement pitch of the plurality of first connectors 30 can be decreased. Consequently, the area of the first substrate 10 occupied by the plurality of first connectors 30 is reduced.

Figure 4:
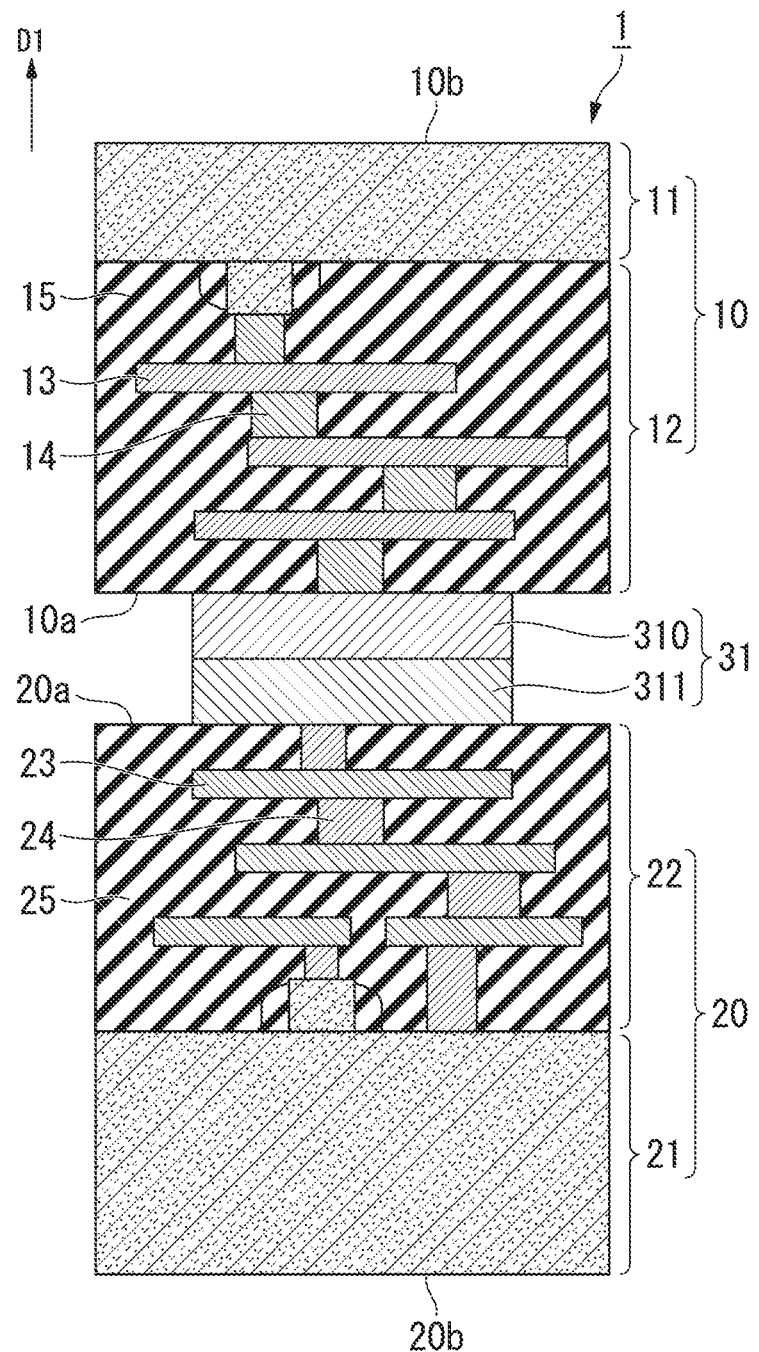
FIG. 4 is a cross-sectional view of the solid-state imaging device according to the first embodiment of the present invention.

FIG. 4 shows an example of the structure of the first connector 31. FIG. 4 shows the cross section of the solid-state imaging device 1.

The first substrate 10 includes a first semiconductor layer 11 and a first wiring layer 12. The first semiconductor layer 11 and the first wiring layer 12 overlap in the thickness direction D1 of the first substrate 10. In addition, the first semiconductor layer 11 and the first wiring layer 12 are in contact with each other.

The first semiconductor layer 11 is formed of a first semiconductor material. For example, the first semiconductor material is silicon (Si). The surface of the first semiconductor layer 11 forms the second principal surface 10*b* of the first substrate 10. The first wiring layer 12 faces the second substrate 20. The surface of the first wiring layer 12 forms the first principal surface 10*a* of the first substrate 10. The first wiring layer 12 includes a first wiring 13, a first via 14 and a first interlayer insulating film 15. In FIG. 4, a reference numeral of a single first wiring 13 is shown as a representative although there are a plurality of first wirings 13. Although there are a plurality of first vias 14, a reference numeral of a single first via 14 is shown as a representative in FIG. 4.

The first wiring 13 and the first via 14 are formed of a first conductive material. For example, the first conductive material is a metal such as aluminum (Al) or copper (Cu). The first wiring 13 and the first via 14 may be formed of different conductive materials. The first wiring 13 is a thin film in which a wiring pattern is formed. The first wiring 13 transmits a control signal. The first wiring 13 may be arranged as only a single layer or arranged as multiple layers. In the example shown in FIG. 4, the first wiring 13 is arranged as three layers.

The first via 14 connects the first wirings 13 of different layers. Part of the first wiring layer 12 other than the first wiring 13 and the first via 14 is composed of the first interlayer insulating film 15. The first interlayer insulating film 15 is formed of a first insulating material. For example, the first insulating material is silicon dioxide (SiO2).

The second substrate 20 includes a second semiconductor layer 21 and a second wiring layer 22. The second semiconductor layer 21 and the second wiring layer 22 overlap in the thickness direction D1 of the first substrate 10. In addition, the second semiconductor layer 21 and the second wiring layer 22 are in contact with each other.

The second semiconductor layer 21 is formed of a second semiconductor material. The second semiconductor material is the same as the first semiconductor material forming the first semiconductor layer 11. Otherwise, the second semiconductor material differs from the first semiconductor material. For example, the second semiconductor material is silicon (Si). The surface of the second semiconductor layer 21 forms the second principal surface 20b of the second substrate 20. The second wiring layer 22 faces the first substrate 10. The surface of the second wiring layer 22 forms the first principal surface 20a of the second substrate 20. The second wiring layer 22 includes a second wiring 23, a second via 24 and a second interlayer insulating film 25. In FIG. 4, a reference numeral of a single second wiring 23 is shown as a representative although there are a plurality of second wirings 23. Although there are a plurality of second vias 24, a reference numeral of a single second via 24 is shown as a representative in FIG. 4.

The second wiring 23 and the second via 24 are formed of a second conductive material. The second conductive material is the same as the first conductive material forming the first wiring 13 and the first via 14. Otherwise, the second conductive material differs from the first conductive material. For example, the second conductive material is a metal such as aluminum (Al) or copper (Cu). The second wiring 23 and the second via 24 may be formed of different conductive materials. The second wiring 23 is a thin film in which a wiring pattern is formed. The second wiring 23 transmits a control signal. The second wiring 23 may be arranged as only a single layer or arranged as multiple layers. In the example shown in FIG. 4, the second wiring 23 is arranged as three layers.

The second via 24 connects the second wirings 23 of different layers. Part of the second wiring layer 22 other than the second wiring 23 and the second via 24 is composed of the second interlayer insulating film 25. The second interlayer insulating film 25 is formed of a second insulating material. The second insulating material is the same as the first insulating material forming the first interlayer insulating film 15. Otherwise, the second insulating material differs from the first insulating material. For example, the second insulating material is silicon dioxide (SiO2).

The first connector 31 includes a first electrode 310 and a second electrode 311. The first electrode 310 and the second electrode 311 overlap in the thickness direction D1 of the first substrate 10. In addition, the first electrode 310 and the second electrode 311 are in contact with each other. The first electrode 310 is in contact with the first principal surface 10a. In addition, the first electrode 310 is in contact with the first via 14 on the first principal surface 10a. Accordingly, the first electrode 310 is electrically connected to the first wiring 13. The second electrode 311 is in contact with the first principal surface 20a. In addition, the second electrode 311 is in contact with the second via 24 on the first principal surface 20a. Accordingly, the second electrode 311 is electrically connected to the second wiring 23.

The first electrode 310 and the second electrode 311 are thin plate type planar electrodes. The first electrode 310 and the second electrode 311 are formed of a third conductive material. The third conductive material is the same as any one of the first conductive material and the second conductive material. Otherwise, the third conductive material differs from both of the first conductive material and the second conductive material. For example, the third conductive material is a metal such as gold (Au), aluminum (Al) or copper (Cu). The first electrode 310 and the second electrode 311 may be formed of different conductive materials.

Each of the plurality of first connectors 32 and the plurality of first connectors 33 may have the same configuration as the first connector 31 shown in FIG. 4. Each of the plurality of second connectors 40 may have the same configuration as the first connector 31 shown in FIG. 4.

As described above, each of the plurality of first connectors 30 and the plurality of second connectors 40 may include the first electrode 310 and the second electrode 311 that are in contact with each other. The first electrode 310 may be in contact with the first substrate 10 and the second electrode 311 may be in contact with the second substrate 20.

Figure 5:
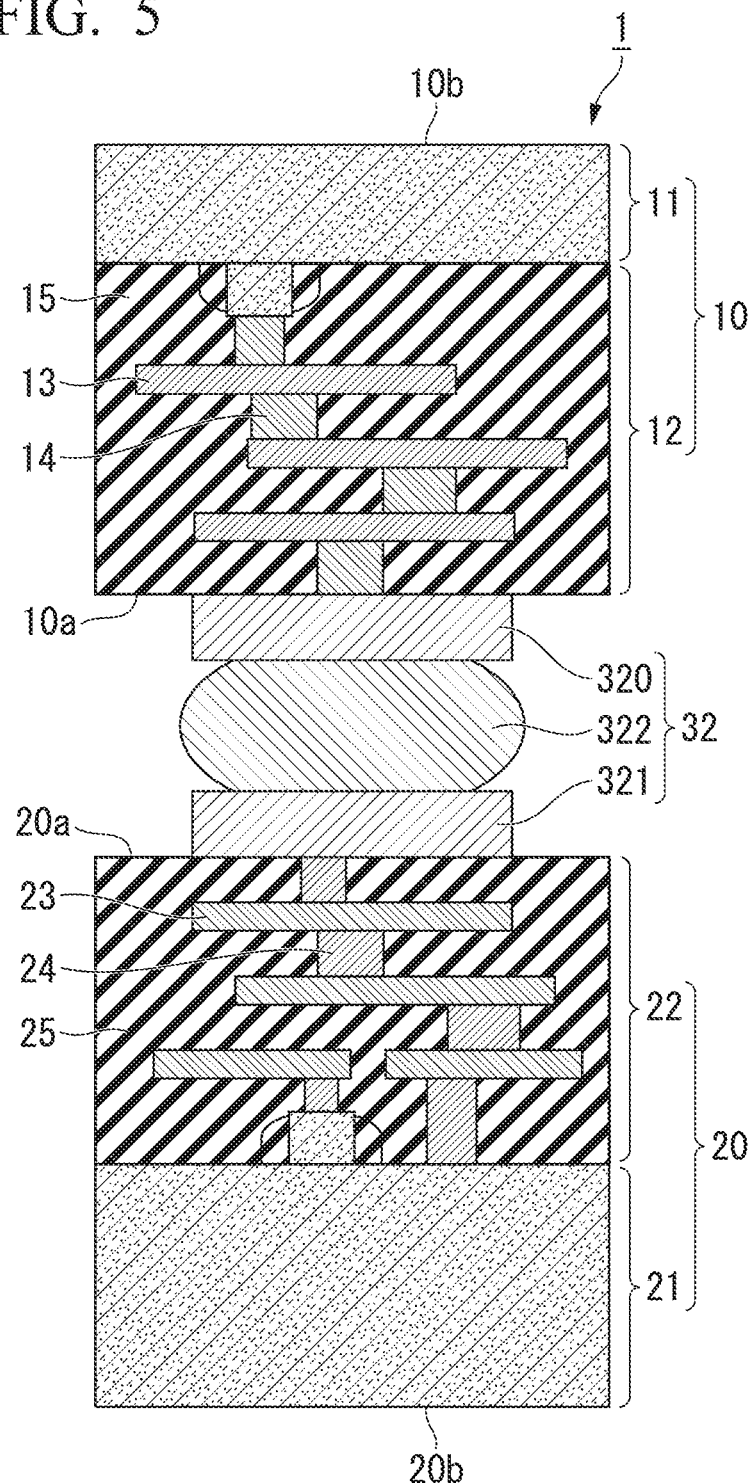
FIG. 5 is a cross-sectional view of the solid-state imaging device according to the first embodiment of the present invention.

FIG. 5 shows an example of the structure of the first connector 32. FIG. 5 shows the cross section of the solid-state imaging device 1. In the structure shown in FIG. 5, points different from the structure shown in FIG. 4 will be described.

The first connector 32 includes a first electrode 320, a second electrode 321 and a bump 322. The first electrode 320 is in contact with the first principal surface 10a. In addition, the first electrode 320 is in contact with the first via 14 in the first principal surface 10a. Accordingly, the first electrode 320 is electrically connected to the first wiring 13. The second electrode 321 is in contact with the first principal surface 20a. In addition, the second electrode 321 is in contact with the second via 24 in the first principal surface 20a. Accordingly, the second electrode 321 is electrically connected to the second wiring 23. The bump 322 is arranged between the first electrode 320 and the second electrode 321. The bump 322 is in contact with the first electrode 320 and the second electrode 321.

The first electrode 320 and the second electrode 321 are thin plate type planar electrodes. The bump 322 is a spherical or hemispherical electrode. The first electrode 320, the second electrode 321 and the bump 322 are formed of a fourth conductive material. The fourth conductive material is the same as any one of the first conductive material, the second conductive material and the third conductive material. Otherwise, the fourth conductive material differs from all of the first conductive material, the second conductive material and the third conductive material. For example, the fourth conductive material is a metal such as gold (Au), aluminum (Al) or copper (Cu). The first electrode 320, the second electrode 321 and the bump 322 may be formed of different conductive materials.

With respect to matters other than that described above, the structure shown in FIG. 5 is the same as the structure shown in FIG. 4.

At least one of the first electrode 320 and the second electrode 321 need not be provided. That is, the bump 322 may be in contact with the first substrate 10. Otherwise, the bump 322 may be in contact with the second substrate 20.

Each of the plurality of first connectors 31 and the plurality of first connectors 33 may have the same configuration as the first connector 32 shown in FIG. 5. Each of the plurality of second connectors 40 may have the same configuration as the first connector 32 shown in FIG. 5.

As described above, each of the plurality of first connectors 30 and the plurality of second connectors 40 may include the bump 322 arranged between the first substrate 10 and the second substrate 20.

Each of the plurality of first connectors 30 and the plurality of second connectors 40 may include the first electrode 320 in contact with the first substrate 10 and the second electrode 321 in contact with the second substrate 20. The bump 322 is arranged between the first electrode 320 and the second electrode 321.

Figure 6:
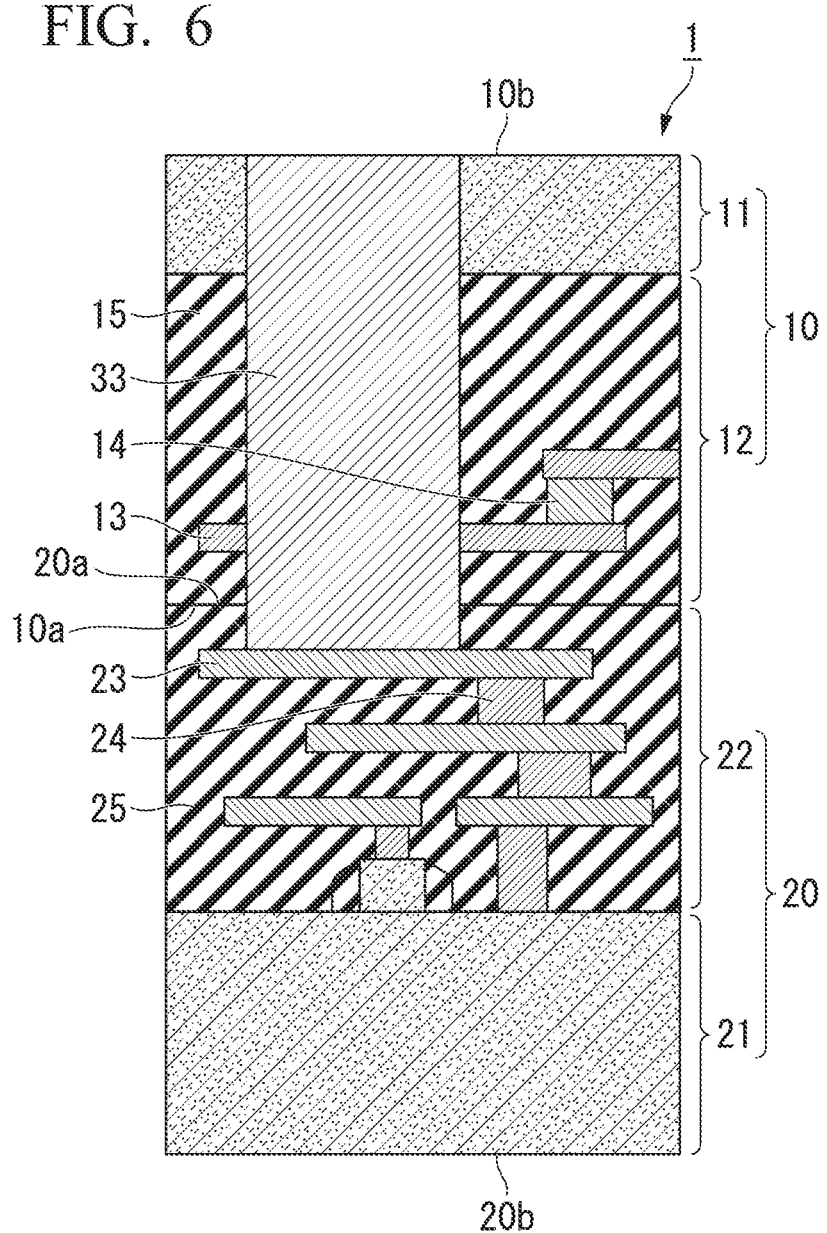
FIG. 6 is a cross-sectional view of the solid-state imaging device according to the first embodiment of the present invention.

FIG. 6 shows an example of the structure of the first connector 33. FIG. 6 shows the cross section of the solid-state imaging device 1. In the structure shown in FIG. 6, points different from the structure shown in FIG. 4 will be described.

The first principal surface 10a and the first principal surface 20a are in contact with each other. That is, the first substrate 10 and the second substrate 20 are in contact with each other. In the example shown in FIG. 6, the first wiring 13 is arranged as two layers.

The first connector 33 is a penetration electrode. The first connector 33 is arranged to penetrate the first semiconductor layer 11 and the first wiring layer 12. That is, the first connector 33 is arranged to penetrate the first substrate 10. The first connector 33 need not penetrate the first substrate 10. The first connector 33 penetrates part of the first wiring 13. The first connector 33 is in contact with the first wiring 13. That is, the first connector 33 is electrically connected to the first wiring 13. Part of the first connector 33 is arranged inside of the second substrate 20. The first connector 33 is in contact with the second wiring 23. That is, the first connector 33 is electrically connected to the second wiring 23. As described above, the first connector 33 penetrates at least one of the plurality of layers forming the first substrate 10 and the second substrate 20. For example, the first connector 33 is a through silicon via (TSV). The first connector 33 may be arranged to penetrate the second semiconductor layer 21 and the second wiring layer 22. That is, the first connector 33 may be arranged to penetrate the second substrate 20. The first connector 33 may be arranged to penetrate both the first substrate 10 and the second substrate 20.

The first connector 33 is formed of a fifth conductive material. The fifth conductive material is the same as any one of the first conductive material, the second conductive material, the third conductive material and the fourth conductive material. Otherwise, the fifth conductive material differs from all of the first conductive material, the second conductive material, the third conductive material and the fourth conductive material. For example, the fifth conductive material is a metal such as aluminum (Al) or copper (Cu).

With respect to matters other than that described above, the structure shown in FIG. 6 is the same as the structure shown in FIG. 4.

Each of the plurality of first connectors 31 and the plurality of first connectors 32 may have the same configuration as the first connector 33 shown in FIG. 6. Each of the plurality of second connectors 40 may have the same configuration as the first connector 33 shown in FIG. 6.

As described above, each of the plurality of first connectors 30 and the plurality of second connectors 40 may include a penetration electrode penetrating at least one of the first substrate and the second substrate arranged across the first substrate 10 and the second substrate 20.

The structures of the first substrate 10 and the second substrate 20 are not limited to the structures shown in FIGS. 4 to 6.

Each of the plurality of first connectors 30 may include the first electrode 320 and the second electrode 321 that are in contact with each other. The first electrode 320 is in contact with the first substrate 10 and the second electrode 321 is in contact with the second substrate 20. Further, each of the plurality of second connectors 40 may include a penetration electrode penetrating at least one of the first substrate and the second substrate arranged across the first substrate 10 and the second substrate 20.

It is difficult to form a thin penetration electrode. In general, the area of a planar electrode can be smaller than the area of a penetration electrode. Accordingly, the area of the connectors decreases compared to a case in which all connectors are formed as penetration electrodes. Since the area of the second connector 40 is larger than the area of the first connector 30, it is easier to form the second connector 40 as a penetration electrode than to form the first connector 30 as a penetration electrode. Compared to a case in which all connectors are formed as planar electrodes, an area variation due to positional displacement between two electrodes is reduced.

The solid-state imaging device of each embodiment of the present invention need not have a component corresponding to at least one of the vertical scanning circuit 200, the column processing circuit 210, the horizontal scanning circuit 220 and the timing generator 230. The solid-state imaging device of each embodiment of the present invention may have three or more substrates. When the solid-state imaging device has three or more substrates, two neighboring substrates correspond to the first substrate 10 and the second substrate 20.

In the first embodiment, the first area of the first region is smaller than the second area of the second region. Accordingly, the solid-state imaging device 1 can reduce the area of a connector. Therefore, the occupancy of the pixels 101 in the solid-state imaging device 1 is increased.

Modified Example

Figure 7:
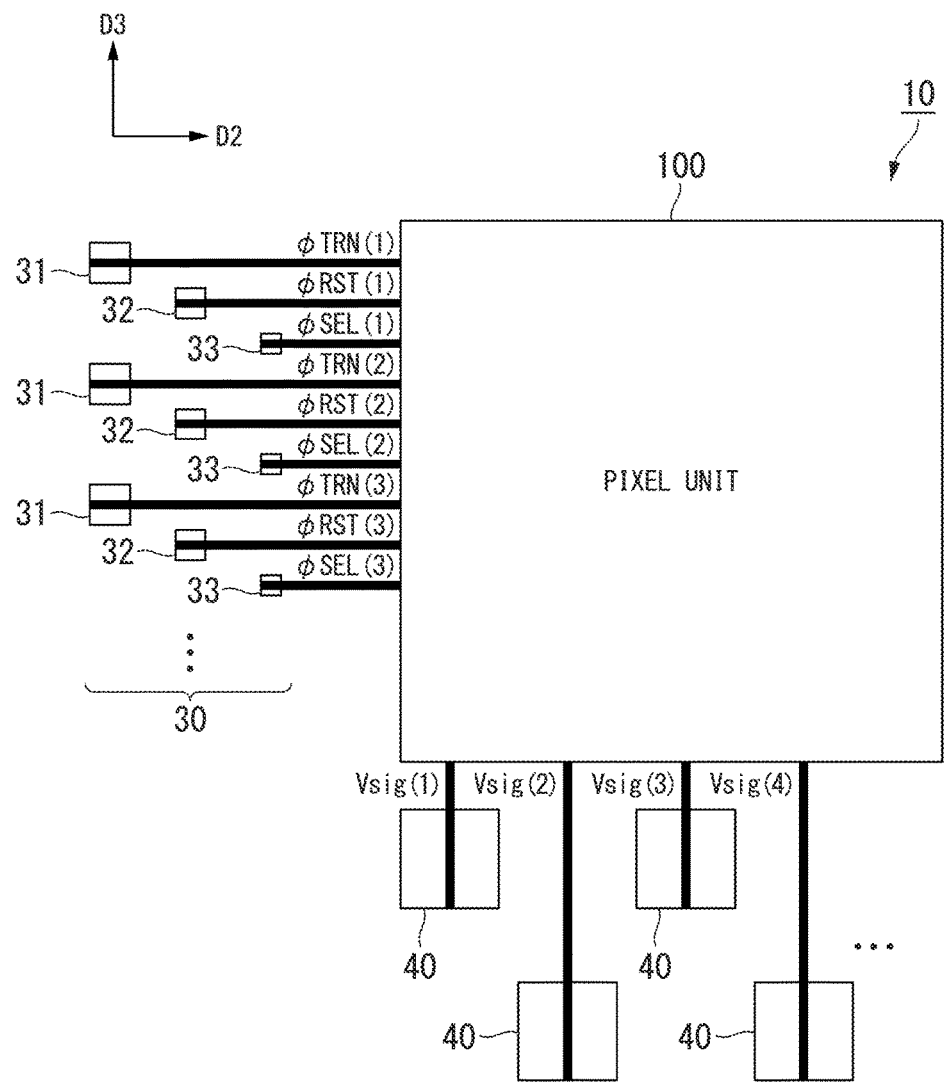
FIG. 7 is a plan view of the first substrate in the solid-state imaging device according to a modified example of the first embodiment of the present invention.

A modified example of the first embodiment will be described. FIG. 7 schematically shows arrangement of each component in the first substrate 10. FIG. 7 is shown as a transparent diagram of the first substrate 10. FIG. 7 shows a state of the first substrate 10 when viewed in a direction perpendicular to the first principal surface 10a. In the configuration shown in FIG. 7, points different from the configuration shown in FIG. 3 will be described.

The area of the first region corresponding to the first connector 32 is smaller than the area of the first region corresponding to the first connector 31. The area of the first region corresponding to the first connector 33 is smaller than the area of the first region corresponding to the first connector 32.

With respect to matters other than that described above, the configuration shown in FIG. 7 is the same as the configuration shown in FIG. 3.

The select transistor T4 serves as a simple switch. The first influence of a minute voltage fluctuation of the select control signal φSEL due to a contact resistance variation of the first connector 33 on the operation of the select transistor T4 is relatively insignificant. Accordingly, the area of the first region corresponding to the first connector 33 may be smaller than the area of the first region corresponding to the first connector 31 or the first connector 32.

While the transfer transistor T1 is turned on, a potential under the gate changes depending on a gate voltage. Due to this change, a charge transfer characteristic of the transfer transistor T1, that is, a transfer speed, changes. Accordingly, the second influence of a minute voltage fluctuation of the transfer control signal φTRN due to a contact resistance variation of the first connector 31 on the operation of the transfer transistor T1 is relatively significant. Therefore, the area of the first region corresponding to the first connector 31 may be greater than the area of the first region corresponding to the first connector 32 or the first connector 33.

While the reset transistor T2 is turned on, the potential of the gate of the amplification transistor T3 changes depending on a gate voltage. Due to this change, the dynamic range of the pixel signal Vsig changes. Accordingly, a minute voltage fluctuation of the reset control signal φRST due to a contact resistance variation of the first connector 32 has the third influence on the operation of the reset transistor T2. However, the third influence is less than the second influence. Accordingly, the area of the first region corresponding to the first connector 32 may be smaller than the area of the first region corresponding to the first connector 31.

As described above, control signals include the transfer control signal φTRN, the reset control signal φRST and the select control signal φSEL, each of which is for controlling the plurality of pixels 101. The first area corresponding to the first connector 33 for transmitting the select control signal φSEL may be smaller than the first area corresponding to the first connector 31 for transmitting the transfer control signal φTRN. The first area corresponding to the first connector 33 for transmitting the select control signal φSEL may be smaller than the first area corresponding to the first connector 32 for transmitting the reset control signal φRST.

Further, the first area corresponding to the first connector 32 for transmitting the reset control signal φRST may be smaller than the first area corresponding to the first connector 31 for transmitting the transfer control signal φTRN.

Second Embodiment

Figure 8:
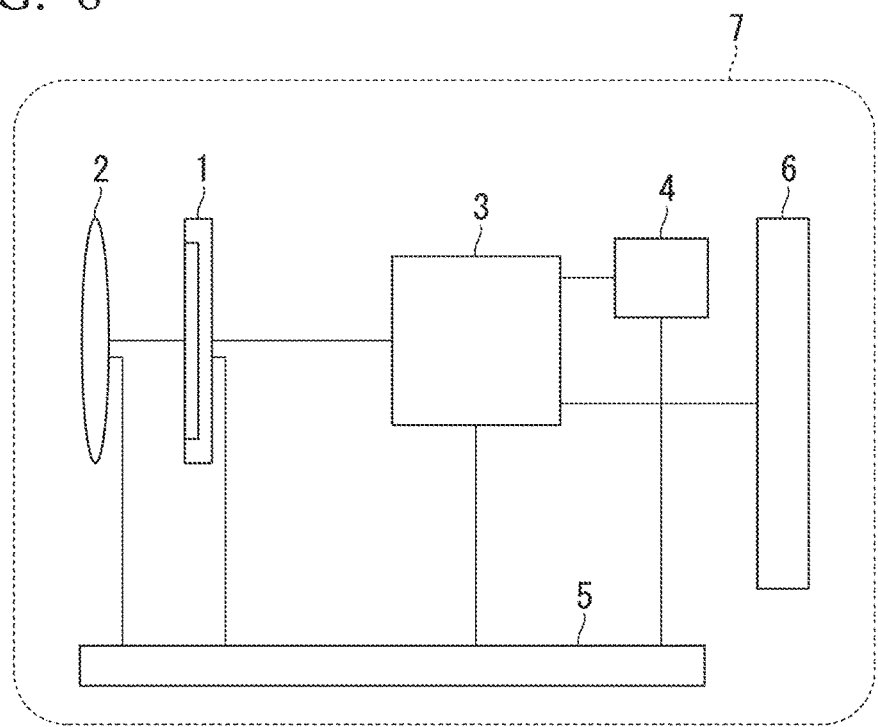
FIG. 8 is a block diagram showing the configuration of an imaging apparatus according to a second embodiment of the present invention.

FIG. 8 shows the configuration of an imaging apparatus 7 of a second embodiment of the present invention. The imaging apparatus 7 has only to be an electronic apparatus having an imaging function. For example, the imaging apparatus 7 is any one of a digital camera, a digital video camera, an endoscope and a microscope. As shown in FIG. 8, the imaging apparatus 7 includes the solid-state imaging device 1, a lens unit 2, an image signal processing device 3, a recording device 4, a camera control device 5, and a display device 6.

The solid-state imaging device 1 is the solid-state imaging device 1 of the first embodiment. The lens unit 2 includes a zoom lens and a focus lens. The lens unit 2 forms a subject image based on light from the subject on a light-receiving surface of the solid-state imaging device 1. The subject image is formed on the light-receiving surface of the solid-state imaging device 1 on the basis of light captured through the lens unit 2. The solid-state imaging device 1 converts the subject image formed on the light-receiving surface into a signal such as an imaging signal and outputs the signal.

The image signal processing device 3 performs predetermined processing on a signal output from the solid-state imaging device 1. The processing performed by the image signal processing device 3 corresponds to conversion into image data, various corrections of image data, compression of image data and the like.

The recording device 4 includes a semiconductor memory and the like for recording or reading image data. The recording device 4 is attachable/detachable to/from the imaging apparatus 7. The display device 6 displays an image based on image data processed by the image signal processing device 3 or image data read from the recording device 4.

The camera control device 5 performs overall control of the imaging apparatus 7. The operation of the camera control device 5 is specified in a program stored in a ROM included in the imaging apparatus 7. The camera control device 5 reads the program and performs various control operations according to the content specified by the program.

As described above, the imaging apparatus 7 includes the solid-state imaging device 1. An imaging apparatus of each embodiment of the present invention need not have a component corresponding to at least one of the lens unit 2, the image signal processing device 3, the recording device 4, the camera control device 5 and the display device 6.

In the second embodiment, the first area of the first region is smaller than the second area of the second region as in the first embodiment. Accordingly, the imaging apparatus 7 having the solid-state imaging device 1 can reduce the area of connectors. Therefore, the percentage of the pixels 101 in the solid-state imaging device 1 is increased.

While preferred embodiments of the invention have been described and shown above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A solid-state imaging device, comprising:
   a first substrate having a principal surface and a plurality of pixels arranged in a matrix;
   a second substrate laminated on the first substrate;
   a plurality of first connectors configured to electrically connect the first substrate and the second substrate and transmit a first signal; and
   a plurality of second connectors configured to electrically connect the first substrate and the second substrate and transmit a second signal,
   wherein the level of the first signal discretely varies between at least two levels, and
   the second signal is a continuous time signal, and
   a first area of a first region is smaller than a second area of a second region, the first region being a projection region of each of the plurality of first connectors in the principal surface, and the second region being a projection region of each of the plurality of second connectors in the principal surface.

2. The solid-state device according to claim 1, wherein a first dimension of the first region is less than a second dimension of the second region, and
   the first dimension and the second dimension are dimensions in a direction of rows or columns in arrangement of the plurality of pixels.

3. The solid-state device according to claim 1, wherein the first signal includes a transfer control signal, a reset control signal and a select control signal, each of which is for controlling the plurality of pixels,
   the first area corresponding to the first connector for transmitting the select control signal is smaller than the first area corresponding to the first connector for transmitting the transfer control signal, and the first area corresponding to the first connector for transmitting the select control signal is smaller than the first area corresponding to the first connector for transmitting the reset control signal.

4. The solid-state device according to claim 3, wherein the first area corresponding to the first connector for transmitting the reset control signal is smaller than the first area corresponding to the first connector for transmitting the transfer control signal.

5. The solid-state device according to claim 1, wherein each of the plurality of first connectors and the plurality of second connectors includes a first electrode and a second electrode that are in contact with each other, and the first electrode is in contact with the first substrate and the second electrode is in contact with the second substrate.

6. The solid-state device according to claim 1, wherein each of the plurality of first connectors and the plurality of second connectors includes a bump arranged between the first substrate and the second substrate.

7. The solid-state device according to claim 1, wherein each of the plurality of first connectors and the plurality of second connectors includes a penetration electrode penetrating at least one of the first substrate and the second substrate arranged across the first substrate and the second substrate.

8. The solid-state device according to claim 1, wherein each of the plurality of first connectors includes a first electrode and a second electrode that are in contact with each other, the first electrode is in contact with the first substrate and the second electrode is in contact with the second substrate, and each of the plurality of second connectors includes a penetration electrode penetrating at least one of the first substrate and the second substrate arranged across the first substrate and the second substrate.

9. An imaging apparatus, comprising the solid-state imaging device according to claim 1.

* * * * *